US011744107B2

(12) United States Patent
Sim et al.

(10) Patent No.: US 11,744,107 B2
(45) Date of Patent: Aug. 29, 2023

(54) DISPLAY DEVICE INCLUDING LIGHT-BLOCKING LAYER DIRECTLY ATTACHED TO SUPPORTING MEMBER FOR IMPROVED VISIBILITY

(71) Applicant: Samsung Display Co., LTD., Yongin-si (KR)

(72) Inventors: Jin Yong Sim, Seongnam-si (KR); Sung Chul Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 111 days.

(21) Appl. No.: 17/186,736

(22) Filed: Feb. 26, 2021

(65) Prior Publication Data
US 2021/0384476 A1 Dec. 9, 2021

(30) Foreign Application Priority Data

Jun. 9, 2020 (KR) .................. 10-2020-0069803
Jun. 12, 2020 (KR) .................. 10-2020-0071869

(51) Int. Cl.
*H10K 50/86* (2023.01)
*H04M 1/02* (2006.01)
*H10K 71/00* (2023.01)

(52) U.S. Cl.
CPC ........ *H10K 50/865* (2023.02); *H04M 1/0214* (2013.01); *H10K 71/00* (2023.02)

(58) Field of Classification Search
CPC . H01L 51/5253; H01L 51/5284; H01L 51/56; H01L 2227/323; H04M 1/0214;
(Continued)

(56) References Cited

U.S. PATENT DOCUMENTS 10,691,175 B2    6/2020 Lee
2016/0380233 A1* 12/2016 Motomura .......... H01L 51/5253
                                              257/40
(Continued)

FOREIGN PATENT DOCUMENTS

KR    10-2019-0082339    7/2019
KR    10-2020-0028063    3/2020
(Continued)

OTHER PUBLICATIONS

Won-Chul Kim et al., "Ultrasonic Bonding of Anisotropic Conductive Films Containing Ultrafine Solder Balls for High-Power and High-Reliability Flex-On-Board Assembly", IEEE Transactions on Components, Packaging and Manufacturing Technology, May 3, 2012, pp. 884-889, vol. 2, No. 5.
(Continued)

*Primary Examiner* — Matthew E. Gordon
(74) *Attorney, Agent, or Firm* — KILE PARK REED & HOUTTEMAN PLLC

(57) ABSTRACT

An electronic device may include a window, a display panel disposed below the window, a supporting member disposed below the display panel, and a light-blocking layer disposed on the supporting member. The light-blocking layer may include a light-blocking material, and the light-blocking layer may be directly disposed on the supporting member or may be directly attached to the supporting member by a light-blocking adhesive layer. Thus, the electronic device has an improved impact resistance property and may prevent reflection of an external light.

14 Claims, 11 Drawing Sheets

(58) Field of Classification Search
CPC .. H10K 50/865; H10K 59/8792; H10K 71/00;
H10K 71/40; H10K 71/421; H10K
71/441
USPC .......................................................... 257/40
See application file for complete search history.

(56) References Cited

U.S. PATENT DOCUMENTS

| | | | |
|---|---|---|---|
| 2017/0346045 A1* | 11/2017 | Mun | C08J 7/0427 |
| 2018/0088631 A1* | 3/2018 | Park | H04M 1/0266 |
| 2018/0366685 A1* | 12/2018 | Park | G06F 3/044 |
| 2019/0013487 A1* | 1/2019 | Park | H01L 51/0097 |
| 2019/0131374 A1* | 5/2019 | Kishimoto | H01L 51/5253 |
| 2019/0288043 A1 | 9/2019 | Shin et al. | |
| 2020/0073441 A1 | 3/2020 | Shin | |
| 2020/0357871 A1 | 11/2020 | Chung et al. | |
| 2021/0026406 A1 | 1/2021 | Kim | |
| 2021/0210715 A1 | 7/2021 | Soh et al. | |

FOREIGN PATENT DOCUMENTS

| | | |
|---|---|---|
| KR | 10-2020-0039866 | 4/2020 |
| KR | 10-2021-0089810 | 7/2021 |

OTHER PUBLICATIONS

Extended European search report for European Patent Application or Patent No. 21178073.9 dated Oct. 28, 2021.

\* cited by examiner

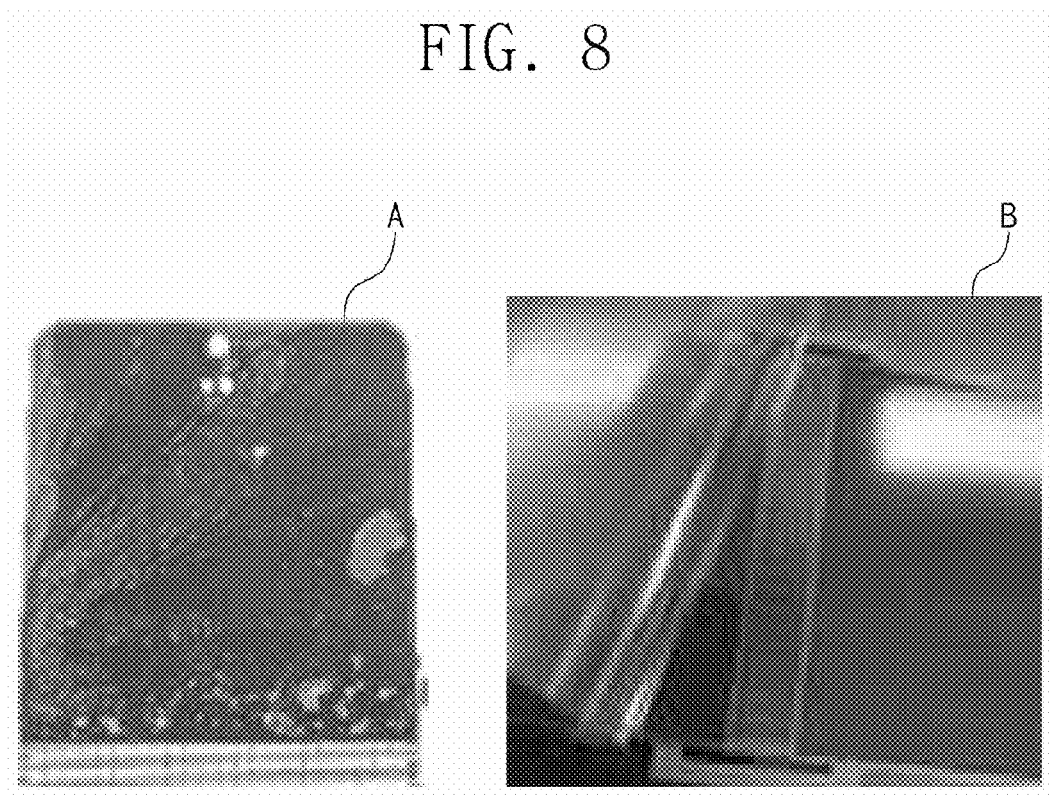

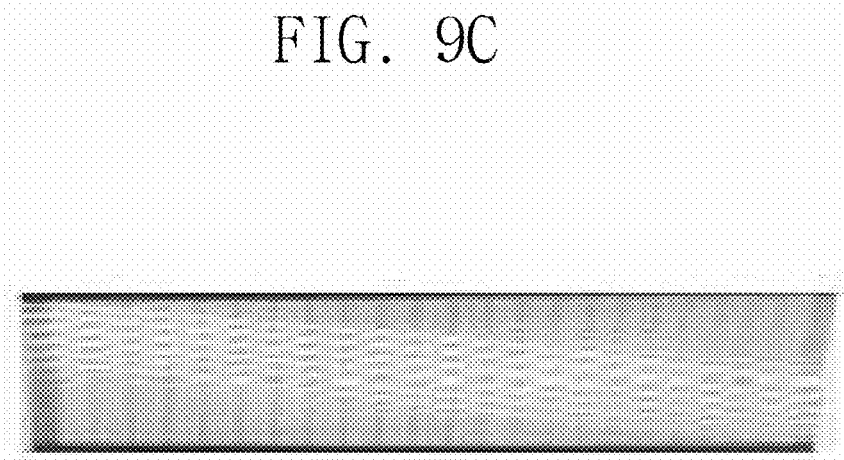

DISPLAY DEVICE INCLUDING LIGHT-BLOCKING LAYER DIRECTLY ATTACHED TO SUPPORTING MEMBER FOR IMPROVED VISIBILITY

CROSS-REFERENCE TO RELATED APPLICATION(S)

This application claims priority to and benefits of Korean Patent Application Nos. 10-2020-0069803 and 10-2020-0071869 under 35 U.S.C. § 119, filed on Jun. 9, 2020 and Jun. 12, 2020respectively, in the Korean Intellectual Property Office, the entire contents of which are incorporated herein by reference.

BACKGROUND

1. Technical Field

The disclosure relates to an electronic device which has an improved impact resistance property and prevents reflection of an external light, and a method of fabricating the same.

2. Description of the Related Art

An electronic device may include an active region that can be selectively activated by an electrical signal. In the electronic device, the active region may be used to sense an input provided from the outside and to display various informative images to a user. Recently, as the shape of the electronic device has been diversified, the active region has also been developed in various shapes.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An embodiment of the disclosure provides an electronic device, which may have an improved impact resistance property and to prevent reflection of an external light, and a method of fabricating the same.

According to an embodiment of the disclosure, an electronic device may include a window, a display panel disposed below the window, a supporting member disposed below the display panel, and a light-blocking layer disposed on the supporting member. The light-blocking layer may include a light-blocking material, and the light-blocking layer may be directly disposed on the supporting member or may be directly attached to the supporting member by a light-blocking adhesive layer.

In an embodiment, the supporting member may include a plate including a metallic material, and the light-blocking layer may be directly disposed on the plate or may be directly attached to the plate by the light-blocking adhesive layer.

In an embodiment, the plate may include a first non-folding region, a folding region, and a second non-folding region, and the plate may include a plurality of openings that overlap the folding region.

In an embodiment, the light-blocking layer may include a plurality of light-blocking openings that overlap the plurality of openings.

In an embodiment, the light-blocking layer may include at least one of a black dye and a black pigment.

In an embodiment, the light-blocking layer may include at least one of a polymer resin, a curing agent, a silane coupling agent, and an amorphous silica particle.

In an embodiment, a mean particle size of a solid in the light-blocking layer may range from about 0.1 μm to about 4 μm.

In an embodiment, the light-blocking layer may include a cross-linking additive agent.

In an embodiment, the light-blocking layer may be a light-blocking coating layer directly coated on the supporting member.

In an embodiment, the light-blocking layer may be a light-blocking sheet attached to the supporting member by the light-blocking adhesive layer.

In an embodiment, the electronic device may further include a lower protection film disposed below the display panel. The light-blocking layer may be directly attached to the lower protection film by an additional adhesive layer.

In an embodiment, a thickness of the light-blocking layer may range from about 7 μm to about 13 μm.

In an embodiment, a surface roughness of the light-blocking layer may be less than or equal to about 0.10 μm.

In an embodiment, a surface adhesion strength of the light-blocking layer may be greater than or equal to about 800 gf.

According to an embodiment of the disclosure, an electronic device may include a window, a display panel disposed below the window, a supporting member disposed below the display panel, and a light-blocking layer disposed on the supporting member. The light-blocking layer may include a light-blocking material and may be directly coated on the supporting member.

According to an embodiment of the disclosure, provided is a method of fabricating an electronic device including a window, a display panel disposed below the window, and a supporting member disposed below the display panel. The method may include fabricating the supporting member and attaching the supporting member to a bottom surface of the display panel. The fabricating of the supporting member may include forming a light-blocking layer by coating a paint including a light-blocking material on a plate, the plate including a metallic material.

In an embodiment, the forming of the light-blocking layer may include coating the paint on the plate using a spray coating method.

In an embodiment, the plate may include a first non-folding region, a folding region, and a second non-folding region. The plate may include a plurality of openings that overlap the folding region, and the forming of the light-blocking layer may be performed such that the paint may be coated on a remaining region of the plate, other than a region overlapping the plurality of openings.

In an embodiment, the light-blocking material may include at least one of a polymer resin, a curing agent, a silane coupling agent, a black pigment, an amorphous silica particle, and a solvent.

In an embodiment, a mean particle size of a solid in the light-blocking material may range from about 0.1 μm to about 4 μm.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 8 is a schematic diagram including images, which were taken to show surface adhesion strength characteristics of plates according to an example embodiment and a comparative embodiment.

FIGS. 9A to 9C are schematic diagrams including images, which were taken to evaluate characteristics of an electronic device according to an embodiment of the disclosure.

Figure 1A:
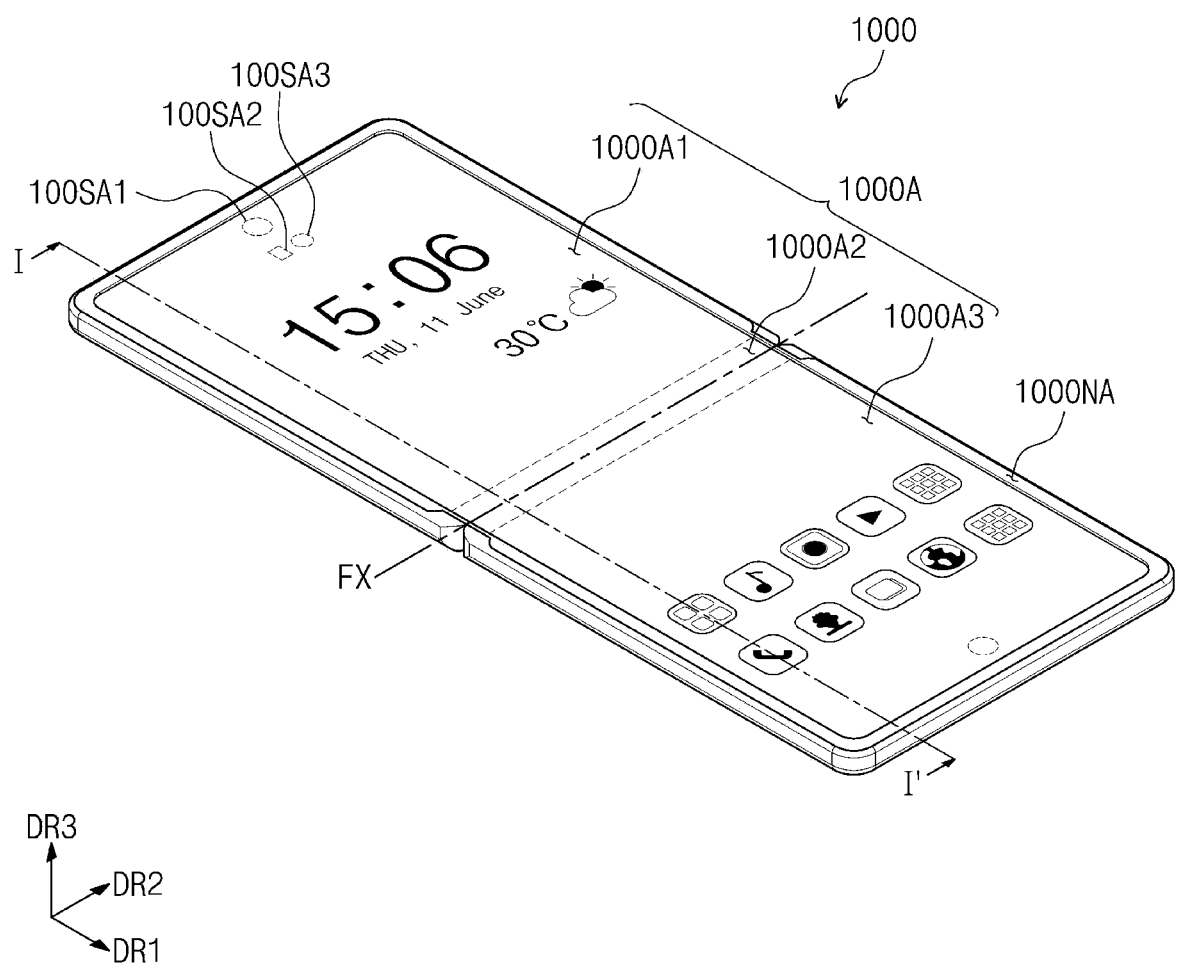
FIG. 1A is a schematic perspective view illustrating an electronic device according to an embodiment of the disclosure.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments of the disclosure will now be described more fully with reference to the accompanying drawings, in which example embodiments are shown. Example embodiments of the disclosure may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

As used herein the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." The phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that terms such as "comprises", "comprising", "has", "having", "includes" and/or "including," specify the presence of stated features, integers, steps, operations, elements and/or components, but do not preclude the presence or addition of one or more other features, integers, steps, operations, elements, components and/or groups thereof.

Example embodiments of the disclosure are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the disclosure should not be construed as limited to the particular shapes of regions illustrated herein but are to include deviations in shapes that result, for example, from manufacturing.

The term overlap may include layer, stack, face or facing, extending over, covering or partly covering or any other suitable term as would be appreciated and understood by those of ordinary skill in the art.

"About " or "approximately" or "substantially" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

Unless otherwise defined, all terms (including technical and scientific terms) used herein have the same meaning as commonly understood by one of ordinary skill in the art to which example embodiments of the disclosure belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
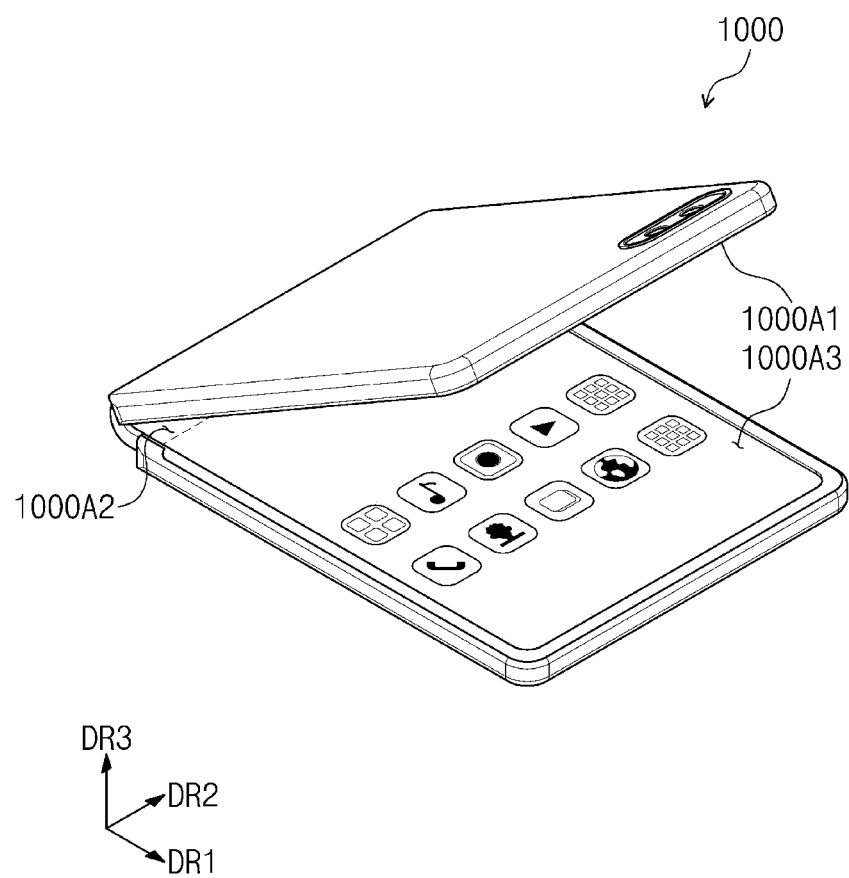
FIG. 1B is a schematic perspective view illustrating an electronic device according to an embodiment of the disclosure.

FIG. 1A is a schematic perspective view illustrating an electronic device according to an embodiment of the disclosure. FIG. 1B is a schematic perspective view illustrating an electronic device according to an embodiment of the disclosure. FIG. 1A illustrates an electronic device 1000 in an unfolded state, and FIG. 1B illustrates the electronic device 1000 in a folded state.

Referring to FIGS. 1A and 1B, the electronic device 1000 may be selectively activated by an electrical signal applied thereto. For example, the electronic device 1000 may be a cellular phone, a tablet, a car navigation system, a gaming machine, or a wearable device, but the disclosure is not limited to these examples. FIG. 1A illustrates an example in which the electronic device 1000 is a cellular phone.

The electronic device 1000 may include an active region 1000A, which may be used to display an image. When the electronic device 1000 is in the unfolded state, the active region 1000A may include a flat surface defined by a first direction DR1 and a second direction DR2. Thickness direction of the electronic device 1000 may be parallel to a third direction DR3 which may be different from both of the first and second directions DR1 and DR2. Thus, a front or top surface and a rear or bottom surface of each of elements constituting the electronic device 1000 may be differentiated from each other based on the third direction DR3.

The active region 1000A may include a first region 1000A1, a second region 1000A2, and a third region 1000A3. The second region 1000A2 may be bent or curved along a folding axis FX parallel to the second direction DR2. Thus, the first region 1000A1 and the third region 1000A3 may be referred to as non-folding regions, and the second region 1000A2 may be referred to as a folding region.

If the electronic device 1000 is folded, the first region 1000A1 and the third region 1000A3 may face each other. Furthermore, if the electronic device 1000 is completely folded, the active region 1000A may not be exposed to the outside, and this state or operation may be referred to as an in-folding state or operation. However, this is just one example, and the operation of the electronic device 1000 is not limited to this example.

For example, the electronic device 1000 may be folded in such a way that the first region 1000A1 may be disposed opposite to the third region 1000A3. In such a folded state, the active region 1000A may be exposed to the outside, and this state or operation may be referred to as an out-folding state or operation.

In an embodiment, the electronic device 1000 may be configured such that only one of the in-folding and out-folding operations is allowed. In another embodiment, the electronic device 1000 may be configured such that both of the in-folding and out-folding operations are allowed. The in-folding and out-folding operations may be performed on the same region of the electronic device 1000 (e.g., the second region 1000A2). In other embodiments, the electronic device 1000 may include at least two different regions, one of which may be folded in the in-folding manner, and another of which may be folded in the out-folding manner.

FIGS. 1A and 1B illustrates an example, in which one folding region and two non-folding regions may be provided, but the numbers of the folding and non-folding regions are not limited thereto. For example, the electronic device 1000 may include two or more non-folding regions and two or more folding regions, each of which may be disposed between adjacent ones of the non-folding regions.

In FIGS. 1A and 1B, the folding axis FX is illustrated to be parallel to a short side of the electronic device 1000, but the disclosure is not limited to this example. For example, the folding axis FX may be designed to be parallel to a long side of the electronic device 1000 or the first direction DR1. The first region 1000A1, the second region 1000A2, and the third region 1000A3 may be sequentially disposed (e.g., arranged) in the second direction DR2.

Sensing regions 100SA1, 100SA2, and 100SA3 may be defined in the electronic device 1000. FIG. 1A illustrates an example with three sensing regions 100SA1, 100SA2, and 100SA3, but the number of the sensing regions is not limited thereto.

The sensing regions 100SA1, 100SA2, and 100SA3 may include a first sensing region 100SA1, a second sensing region 100SA2, and a third sensing region 100SA3. For example, the first sensing region 100SA1 may overlap a camera module, the second and third sensing regions 100SA2 and 100SA3 may overlap an ambient light sensor, but the disclosure is not limited to this example.

Each electronic module may receive an input signal, which may be transmitted from the outside through the first, second, or third sensing region 100SA1, 100SA2, or 100SA3, or may provide an output signal to the outside through the first, second, or third sensing region 100SA1, 100SA2, or 100SA3.

The first sensing region 100SA1 may be enclosed by the active region 1000A, and the second and third sensing regions 100SA2 and 100SA3 may be included in the active region 1000A. In other words, the second and third sensing regions 100SA2 and 100SA3 may be used to display an image. Each of the first, second, and third sensing regions 100SA1, 100SA2, and 100SA3 may have transmittance that may be higher than that of the active region 1000A. In an embodiment, the transmittance of the first sensing region 100SA1 may be higher than each of the transmittance of the second sensing region 100SA2 and the transmittance of the third sensing region 100SA3.

According to an embodiment of the disclosure, some electronic modules may overlap the active region 1000A, and others of the electronic modules may be enclosed by the active region 1000A. Thus, it may be unnecessary to restrict a region for the electronic modules within a peripheral region 1000NA around the active region 1000A. As a result, a ratio of an area of the active region 1000A to a total area of the electronic device 1000 may be increased.

Figure 2:
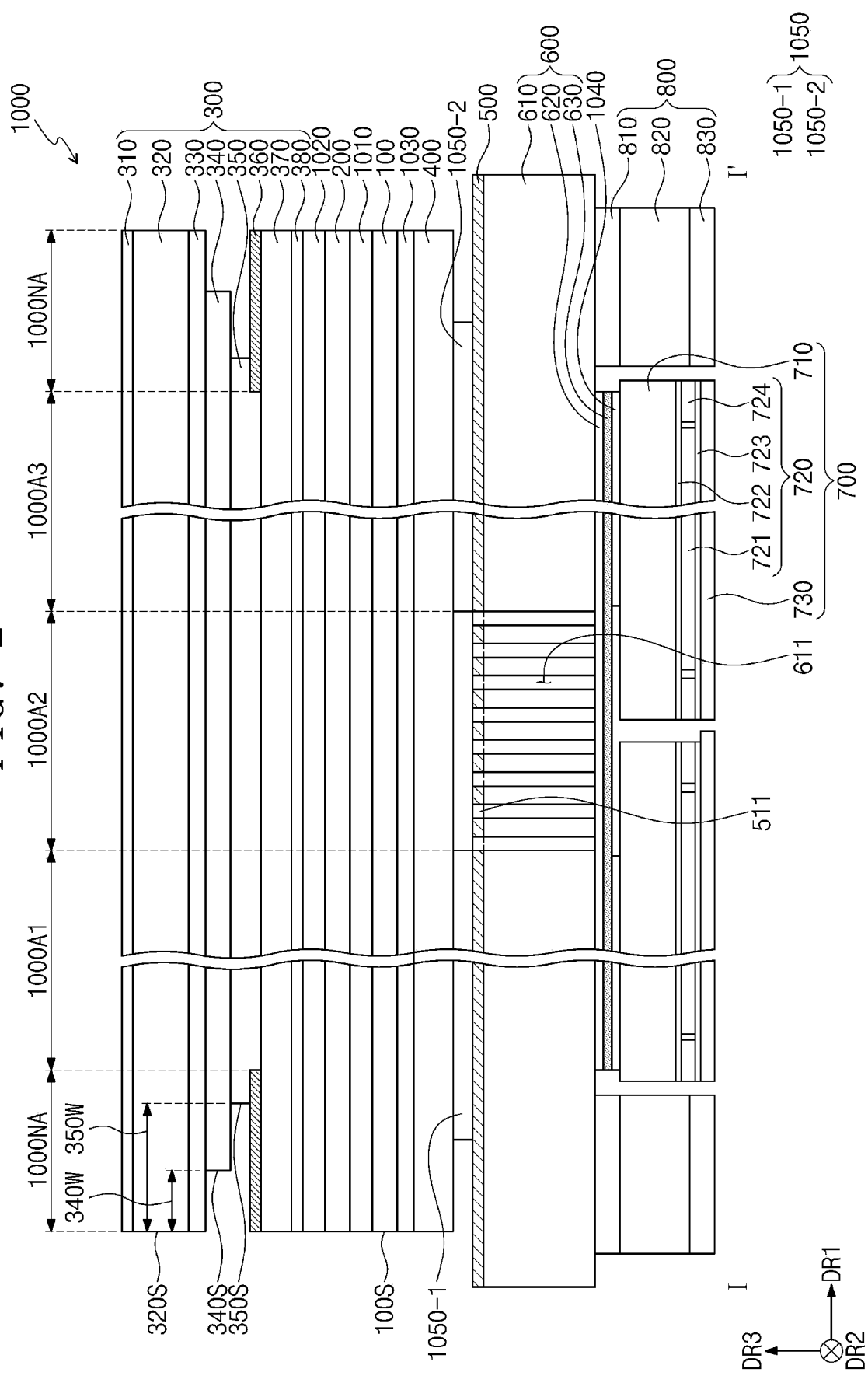
FIG. 2 is a schematic sectional view illustrating an electronic device according to an embodiment of the disclosure.
Figure 3:
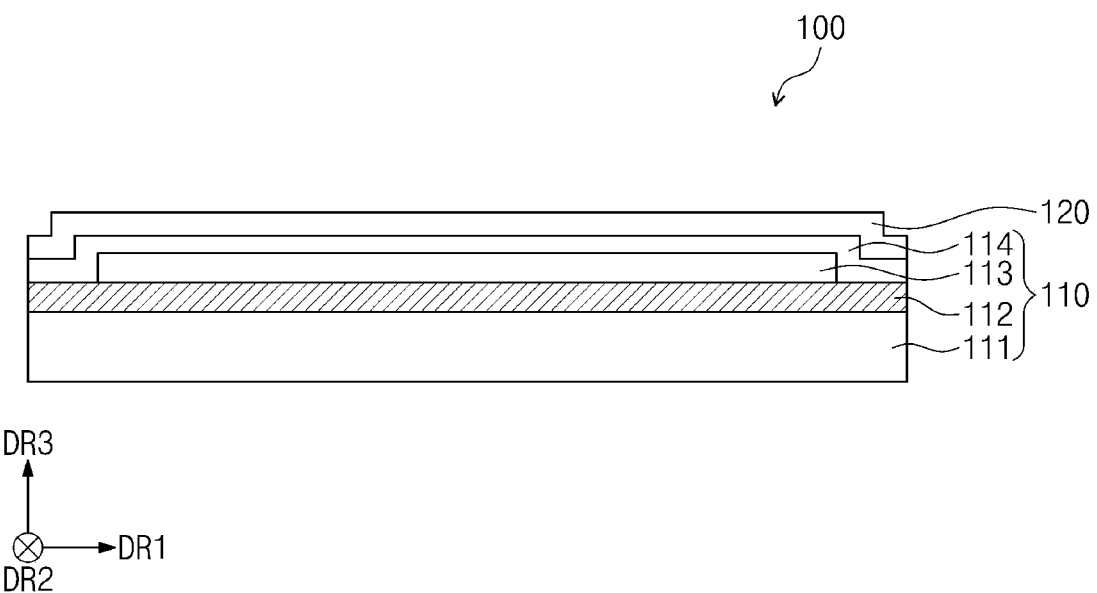
FIG. 3 is a schematic sectional view illustrating a display panel according to an embodiment of the disclosure.

FIG. 2 is a schematic sectional view illustrating an electronic device according to an embodiment of the disclosure. For example, FIG. 2 is a sectional view taken along a line I-I' of FIG. 1A. FIG. 3 is a schematic sectional view illustrating a display panel according to an embodiment of the disclosure.

Referring to FIG. 2, the electronic device 1000 may include a display panel 100, upper functional layers, and lower functional layers.

Referring to FIG. 3, the display panel 100 may produce an image and to sense an input signal provided from the outside. For example, the display panel 100 may include a display layer 110 and a sensor layer 120. A thickness of the display panel 100 may range from about 25 µm to about 35 µm and may be, for example, about 30 µm, but the thickness of the display panel 100 is not limited thereto.

The display layer 110 may be an element substantially producing the image. The display layer 110 may be a light-emitting type display layer. For example, the display layer 110 may be an organic light emitting display layer, a quantum dot display layer, or a micro-LED display layer.

The display layer 110 may include a base layer 111, a circuit layer 112, a light-emitting device layer 113, and an encapsulation layer 114.

The base layer 111 may include a synthetic resin film. The synthetic resin layer may include a thermosetting resin. The base layer 111 may have a multi-layered structure. For example, the base layer 111 may have a triple-layered structure including a synthetic resin layer, an adhesive layer, and a synthetic resin layer. The synthetic resin layer may be a polyimide-based resin layer, but the disclosure is not limited to a material of the base layer 111. The synthetic resin layer may be formed of or include at least one of acryl resins, methacryl resins, polyisoprene resins, vinyl resins, epoxy resins, urethane resins, cellulose resins, siloxane resins, polyamide resins, and perylene resins. In certain cases, the base layer 111 may include a glass substrate or a substrate made of an organic/inorganic composite material.

The circuit layer 112 may be disposed on the base layer 111. The circuit layer 112 may include an insulating layer, a semiconductor pattern, a conductive pattern, and a signal line. For example, at least one of insulating, semiconductor, and conductive layers may be formed on the base layer 111 by a coating or deposition method and may be selectively patterned through one or more photolithography processes. The semiconductor pattern, the conductive pattern, and the signal line in the circuit layer 112 may be formed by this process or by repeating this process.

The light-emitting device layer 113 may be disposed on the circuit layer 112. The light-emitting device layer 113 may include a light-emitting device. For example, the light-emitting device layer 113 may include an organic light emitting material, quantum dots, quantum rods, or micro-LEDs.

The encapsulation layer 114 may be disposed on the light-emitting device layer 113. The encapsulation layer 114 may include an inorganic layer, an organic layer, and an inorganic layer, which may be sequentially stacked on each other, and the structure of the encapsulation layer 114 is not limited to this example.

The inorganic layers may protect the light-emitting device layer 113 from moisture or oxygen, and the organic layer may protect the light-emitting device layer 113 from a contamination material (e.g., dust particles). Each of the inorganic layers may include a silicon nitride layer, a silicon oxynitride layer, a silicon oxide layer, a titanium oxide layer, an aluminum oxide layer, or a combination thereof. The organic layer may include an acrylic organic layer, but the disclosure is not limited thereto.

The sensor layer 120 may be disposed on the display layer 110. The sensor layer 120 may sense an external input provided from the outside. The external input may be an input signal provided from a user. For example, the input signal from the user may include various types of external inputs caused by a part of a user's body, light, heat, pressure, or a pen.

The sensor layer 120 may be formed on the display layer 110 in a successive manner. It may be expressed that the sensor layer 120 may be directly disposed on the display layer 110. This expression may mean that there may be no other element between the sensor layer 120 and the display layer 110. In other words, any other adhesive member may not be disposed between the sensor layer 120 and the display layer 110.

In an embodiment, the sensor layer 120 may be combined to the display layer 110 through an adhesive member. The adhesive member may be a typical adhesive material, a typical gluing agent, or a combination thereof.

Referring back to FIG. 2, the upper functional layers may be disposed on the display panel 100. For example, the upper functional layers may include an anti-reflection member 200 and an upper member 300.

The anti-reflection member 200 may be referred to as an anti-reflection layer. The anti-reflection member 200 may reduce reflectance of an external light to be incident from the outside. The anti-reflection member 200 may include an elongation-type synthetic resin film. For example, the anti-reflection member 200 may be provided by dyeing a polyvinyl alcohol (PVA) film with an iodine compound. However, the material for the anti-reflection member 200 is not limited to this example. The anti-reflection member 200 may have a thickness ranging from about 25 µm to about 35 µm (for example, about 31 µm), but the thickness of the anti-reflection member 200 is not limited thereto.

In an embodiment, the anti-reflection member 200 may include color filters. The color filters may be disposed to form a specific arrangement. The arrangement of the color filters in the anti-reflection member 200 may be determined in consideration of colors of lights to be emitted from pixels in the display layer 110. Furthermore, the anti-reflection layer may further include a black matrix that may be disposed adjacent to the color filters.

In an embodiment, the anti-reflection member 200 may include a destructive interference structure. For example, the destructive interference structure may include a first reflection layer and a second reflection layer which may be provided on different layers. First and second reflection lights, which may be respectively reflected by the first and second reflection layers, may destructively interfere with each other, and thus, the reflectance of the external light may be reduced.

The anti-reflection member 200 may be combined to the display panel 100 through a first adhesive layer 1010. The first adhesive layer 1010 may be a transparent adhesive layer, such as a pressure sensitive adhesive (PSA) film, an optically clear adhesive (OCA) film, an optically clear resin (OCR) film, or a combination thereof. In various embodiments to be described below, the adhesive layer may include a typical adhesive material or a gluing agent. The first adhesive layer 1010 may have a thickness ranging from about 20 µm to about 30 µm (for example, about 25 µm), but the thickness of the first adhesive layer 1010 is not limited thereto.

In an embodiment, the first adhesive layer 1010 may be omitted, and the anti-reflection member 200 may be directly disposed on the display panel 100. In an embodiment, another adhesive layer may not be disposed between the anti-reflection member 200 and the display panel 100.

The upper member 300 may be disposed on the anti-reflection member 200. The upper member 300 may include a first hard coating layer 310, a protection layer 320, a first upper adhesive layer 330, a window 340, a second upper adhesive layer 350, a black matrix 360, an impact absorption layer 370, and a second hard coating layer 380. Elements constituting the upper member 300 are not limited to the afore-described elements. For example, at least one of the afore-described elements may be omitted, and other elements may be further provided as additional elements of the upper member 300.

The first hard coating layer 310 may be the outermost layer of the electronic device 1000. The first hard coating layer 310 may be a functional layer, which may be coated on the protection layer 320 and may be used to improve usage characteristics of the electronic device 1000. For example, the first hard coating layer 310 may prevent fingerprint, contamination, and scratch issues.

The protection layer 320 may be disposed below the first hard coating layer 310. The protection layer 320 may protect elements thereunder. An anti-fingerprint layer, in addition to the first hard coating layer 310, may be further provided on the protection layer 320 to improve chemical- and corrosion-resistance properties. The protection layer 320 may include a film whose elastic modulus may be less than about 15 GPa at room temperature. The protection layer 320 may have a thickness ranging from about 50 µm to about 60 µm (for example, about 55 µm), but the thickness of the protection layer 320 is not limited thereto. In an embodiment, the protection layer 320 may be omitted.

The first upper adhesive layer 330 may be disposed below the protection layer 320. The first upper adhesive layer 330 may be used to combine the protection layer 320 and the window 340 to each other. The first upper adhesive layer 330 may have a thickness ranging from about 20 µm to about 30 µm (for example, about 25 µm), but the thickness of the first upper adhesive layer 330 is not limited thereto.

The window 340 may be disposed below the first upper adhesive layer 330. The window 340 may be formed of or include an optically transparent insulating material. For example, the window 340 may include a glass substrate, a synthetic resin film, or a combination thereof. If the window 340 is the glass substrate, the window 340 may have a thickness of about 80 µm or thinner (e.g., about 30 µm), but the thickness of the window 340 is not limited thereto.

In the case where the window 340 is the synthetic resin film, the window 340 may include a polyimide (PI) film, a polyethylene terephthalate (PET) film, or a combination thereof.

The window 340 may have a multi- or single-layered structure. For example, the window 340 may include synthetic resin films, which may be combined to each other by an adhesive material, or a glass substrate and a synthetic resin film, which may be combined to each other by an adhesive material.

The second upper adhesive layer 350 may be disposed below the window 340. The second upper adhesive layer 350 may be used to combine the window 340 and the impact absorption layer 370 to each other. The second upper adhesive layer 350 may have a thickness ranging from about 30 µm to about 40 µm (for example, about 35 µm), but the thickness of the second upper adhesive layer 350 is not limited thereto.

In an embodiment, a side surface 340S of the window 340 and a side surface 350S of the second upper adhesive layer 350 may be placed inwardly relative to side surfaces of other layers (e.g., a side surface 100S of the display panel 100 and a side surface 320S of the protection layer 320). This means that the side surfaces 340S and 350S may be closer to the active region 1000A than other side surfaces.

A folding operation of the electronic device 1000 may lead to a change in relative positions of layers constituting the electronic device 1000. According to an embodiment of the disclosure, since the side surface 340S of the window 340 may be placed inwardly relative to the side surface 100S of the display panel 100 and the side surface 320S of the protection layer 320, it may be possible to suppress or prevent the side surface 340S of the window 340 from protruding out of the side surface 320S of the protection layer 320, even when there is a change in relative positions of the layers. Thus, it may be possible to prevent an external impact from being exerted on the window 340 through the side surface 340S. As a result, cracking issues in the window 340 may be reduced.

A first distance 340W between the side surface 340S of the window 340 and the side surface 320S of the protection layer 320 may be larger than a distance. Here, the first distance 340W may be a distance measured in the first direction DR1. The first distance 340W may correspond to a distance between the side surface 340S and the side surface 320S, when viewed in a plan view.

The first distance 340W may range from about 180 µm to about 205 µm and may be for example about 196 µm, but the disclosure is not limited to this value or range. For example, the first distance 340W may be larger than about 50 µm or may be about 300 µm. The larger the first distance 340W, the longer a portion of the protection layer 320 protruding from the window 340, and a portion of the protection layer 320 may be bent and may be attached to other elements (e.g., a case). In the case where an area of the protection layer 320 may be increased, it may be possible to easily prevent a contamination material from passing through the protection layer 320 in a downward or upward direction.

The window 340 and the second upper adhesive layer 350 may be attached to the impact absorption layer 370 by a lamination process. The window 340 and the second upper adhesive layer 350 may be designed to have areas that may be smaller than an area of the impact absorption layer 370, in consideration of an error in the lamination process. In an embodiment, the area of the second upper adhesive layer 350 may be smaller than the area of the window 340. Pressure may be exerted on the second upper adhesive layer 350, during the attaching process of the window 340. The second upper adhesive layer 350 may be stretched in the first and second directions DR1 and DR2 by the pressure. Even in this case, the second upper adhesive layer 350 may not protrude from the window 340, because, as described above, the second upper adhesive layer 350 has an area smaller than the window 340.

In the case where the first and second upper adhesive layers 330 and 350 are attached to the window 340, the window 340 may not slip during the folding operation of the electronic device 1000, and thus, a buckling issue may occur in the window 340. By contrast, according to an embodiment of the disclosure, the area of the second upper adhesive layer 350 may be smaller than the area of the window 340.

Thus, the first upper adhesive layer 330 may not be attached to the second upper adhesive layer 350, and moreover, it may be possible to prevent or suppress a contamination material from being attached to the second upper adhesive layer 350.

A second distance 350W between the side surface 350S of the second upper adhesive layer 350 and the side surface 320S of the protection layer 320 may be larger than a distance. Here, the second distance 350W may be a distance measured in the first direction DR1. When viewed in a plan view, the second distance 350W may correspond to a distance between the side surface 350S and the side surface 320S.

The second distance 350W may be about 392 μm, but the disclosure is not limited to this value. For example, the second distance 350W may range from about 292 μm to about 492 μm, but the disclosure is not limited to this range. The black matrix 360 may be disposed between the impact absorption layer 370 and the second upper adhesive layer 350. The black matrix 360 may be provided on a top surface of the impact absorption layer 370 by a printing method. The black matrix 360 may overlap the peripheral region 1000NA. The black matrix 360 may be a colored layer formed by a coating method. The black matrix 360 may include a colored organic material or an opaque metal, but the material of the black matrix 360 is not limited thereto.

FIG. 2 illustrates an example, in which the black matrix 360 may be disposed on the top surface of the impact absorption layer 370, but the position of the black matrix 360 is not limited to this example. For example, the black matrix 360 may be provided on at least one of top and bottom surfaces of the protection layer 320 and top and bottom surfaces of the window 340. The black matrix 360 may be provided to have layers, and some of the layers may be provided on the top surface of the impact absorption layer 370 and others of the layers may be provided on at least one of the top and bottom surfaces of the protection layer and window 320 and 340.

The impact absorption layer 370 may be a functional layer, which may be used to protect the display panel 100 from an external impact. The impact absorption layer 370 may be selected from films whose elastic moduli may be higher than about 1 GPa at room temperature. The impact absorption layer 370 may be an elongated film with an optical function. For example, the impact absorption layer 370 may be an optical axis control film. The impact absorption layer 370 may have a thickness ranging from about 35 μm to about 45 μm (for example, about 41 μm), but the thickness of the impact absorption layer 370 is not limited thereto. In an embodiment, the impact absorption layer 370 may be omitted.

In the case where the impact absorption layer 370 may be omitted, the anti-reflection member 200 may be attached to the window 340 by an adhesive layer. The anti-reflection member 200 may be in contact with a bottom surface of a second adhesive layer 1020, and the window 340 may be in contact with a top surface of the second adhesive layer 1020. If the impact absorption layer 370 is omitted, the black matrix 360 may be disposed on the top surface of the protection layer 320, the bottom surface of the protection layer 320, the top surface of the window 340, or the bottom surface of the window 340.

The second hard coating layer 380 may be provided on a surface of the impact absorption layer 370. The impact absorption layer 370 may have an uneven surface. The top surface of the impact absorption layer 370 may be in contact with the second upper adhesive layer 350. Thus, the uneven structure of the top surface of the impact absorption layer 370 may be filled with the second upper adhesive layer 350. Accordingly, it may be possible to prevent an optical issue from occurring on the top surface of the impact absorption layer 370. A bottom surface of the impact absorption layer 370 may be covered with the second hard coating layer 380 having a flat surface. Since the second hard coating layer 380 covers the uneven surface of the impact absorption layer 370, it may be possible to prevent a haze issue, which may be caused by the uneven surface.

The upper member 300 may be coupled to the anti-reflection member 200 by the second adhesive layer 1020. The second adhesive layer 1020 may include a typical adhesive material, a gluing agent, or a combination thereof. The second adhesive layer 1020 may have a thickness ranging from about 20 μm to about 30 μm (for example, about 25 μm), but the thickness of the second adhesive layer 1020 is not limited thereto.

The lower functional layers may be disposed below the display panel 100. For example, the lower functional layers may include a lower protection film 400, a light-blocking layer 500, a first lower member 600, a second lower member 700, and a height-difference compensation member 800. Elements constituting the lower functional layers are not limited to the afore-described elements. For example, at least one of the afore-described elements may be omitted, and other elements may be further provided as additional elements of the lower functional layers.

The lower protection film 400 may be combined to the rear surface of the display panel 100 by a third adhesive layer 1030. The lower protection film 400 may prevent a scratch from occurring on the rear surface of the display panel 100 during a fabrication process of the display panel 100. The lower protection film 400 may be a colored polyimide film. For example, the lower protection film 400 may be an opaque yellow film, but the disclosure is not limited to this example.

The lower protection film 400 may have a thickness ranging from about 40 μm to about 80 μm (for example, about 68 μm). The third adhesive layer 1030 may have a thickness ranging from about 13 μm to about 25 μm (for example, about 18 μm). However, the thicknesses of the lower protection film 400 and the third adhesive layer 1030 are not limited to these values or ranges.

The light-blocking layer 500 may be disposed below the lower protection film 400 and may be disposed on the first lower member 600, which will be described below.

The light-blocking layer 500 may be a light-blocking coating layer that may be coated on the top surface of the first lower member 600. The light-blocking layer 500 may be in contact with the top surface of the first lower member 600. The first lower member 600 may include a plate 610, which may be formed of or include a metallic material, and the light-blocking layer 500 may be in contact with a top surface of the plate 610.

The light-blocking layer 500 may include a light absorbing material (e.g., a black material), which prevents an external light from being reflected by the first lower member 600 thereunder. The light-blocking layer 500 may include, for example, a black dye, a black pigment, or a combination thereof. In an embodiment, the black pigment of the light-blocking layer 500 may include carbon black.

In an embodiment, the light-blocking layer 500 may include a polymer resin that may be used as a medium material in which the black pigment (e.g., the carbon black) may be dispersed. The light-blocking layer 500 may include carbon black, which may be dispersed in a polymer material, such as, an acrylic resin, a melamine resin, an epoxy resin, or a combination thereof. The light-blocking layer 500 may further include cellulose acetate butyrate which may be used as the polymer material. The light-blocking layer 500 may be a single layer that may be made of the polymer resin, in which the carbon black may be dispersed.

The light-blocking layer 500 may further include at least one of a curing agent, a silane coupling agent, and an amorphous silica particle. In an embodiment, the curing agent of the light-blocking layer 500 may include block poly isocyanate. The silane coupling agent of the light-blocking layer 500 may include glycidoxy propyl trimethoxy silane.

The light-blocking layer 500 may further include a cross-linking additive agent. The cross-linking additive agent may be formed of or include at least one of materials capable of accelerating a cross-linking reaction in the forming of the light-blocking layer 500 and improving a cross-linking density and a surface adhesion strength of the light-blocking layer 500. The cross-linking additive agent may be a co-cross-linking agent. The cross-linking additive agent may include, for example, trimethylolpropane trimethacrylate. Since the light-blocking layer 500 further includes the cross-linking additive agent, it may be possible to maintain surface roughness of the light-blocking layer 500 to a low level and to improve the surface adhesion strength of the light-blocking layer 500.

A mean particle size of solid in the light-blocking layer 500 may range from about 0.1 μm to about 4 μm. In particular, the mean particle size of the solid in the light-blocking layer 500 may range from about 2 μm to about 3 μm. If the mean particle size of the solid in the light-blocking layer 500 is less than about 0.1 μm, there may be a difficulty in the process, and the light-blocking layer 500 may suffer from a low surface adhesion strength, and this may lead to a reduction in adhesion strength with an additional adhesive layer 1050 thereon. If the mean particle size of the solid in the light-blocking layer 500 is larger than about 4 μm, the surface roughness of the light-blocking layer 500 may be increased, and the surface of the light-blocking layer 500 may be recognized by a user.

The surface roughness of the light-blocking layer 500 may be less than or equal to about 0.10 μm. If the surface roughness of the light-blocking layer 500 is greater than about 0.10 μm, the surface quality of the light-blocking layer 500 may be deteriorated, and moreover, since the surface of the light-blocking layer 500 may be recognized by a user, a display quality of the electronic device may be deteriorated.

The light-blocking layer 500 may have a surface adhesion strength of about 800 gf or higher. If the surface adhesion strength of the light-blocking layer 500 is less than about 800 gf, an adhesion strength between the light-blocking layer 500 and the additional adhesive layer 1050 may be weaker than an adhesion strength between a release film and the additional adhesive layer 1050, and a reverse-delamination issue may occur during a process of attaching the additional adhesive layer 1050 to the light-blocking layer 500.

The light-blocking layer 500 may be attached to the lower protection film 400 by the additional adhesive layer 1050. The additional adhesive layer 1050 may be disposed between the light-blocking layer 500 and the lower protection film 400 to combine the light-blocking layer 500 and the lower protection film 400 to each other. The light-blocking layer 500 may be directly attached to the lower protection film 400 by the additional adhesive layer 1050. In the disclosure, the expression "two elements may be directly attached to each other by an adhesive layer" means that the elements may be combined to each other with or by the adhesive layer interposed therebetween, without any element, such as a portion of a layer, film, region, or plate interposed therebetween. For example, the expression "two elements may be directly attached to each other by an adhesive layer" means that two elements (e.g., layers or members) may be combined with each other by the adhesive layer therebetween. The light-blocking layer 500 may be in contact with a bottom surface of the additional adhesive layer 1050, and the lower protection film 400 may be in contact with a top surface of the additional adhesive layer 1050.

In an embodiment, the additional adhesive layer 1050 may not be disposed on a region of the first lower member 600, in which an opening 611 may be defined. For example, the additional adhesive layer 1050 may include a first additional adhesive layer 1050-1 and a second additional adhesive layer 1050-2, which may be spaced apart from each other, and the opening 611 may be interposed between the first and second additional adhesive layers 1050-1 and 1050-2, when viewed in a plan view.

The light-blocking layer 500 may have a thickness ranging from about 7 μm to about 13 μm. In an embodiment, the thickness of the light-blocking layer 500 may range from about 8 μm to about 12 μm. If the thickness of the light-blocking layer 500 is less than about 7 μm, a light-blocking property of the light-blocking layer 500 may be deteriorated, and the light-blocking layer 500 coated on the first lower member 600 may suffer from low durability. If the thickness of the light-blocking layer 500 is larger than about 13 μm, the light-blocking layer 500 may be thickly formed on the first lower member 600, and it may be difficult to improve a folding property of the electronic device 1000 and a layer-forming property of the light-blocking layer 500.

In the fabricating of the electronic device 1000 according to an embodiment of the disclosure, the light-blocking layer 500 may be coated on the first lower member 600, which may be included in the electronic device 1000, and the first lower member 600 coated with the light-blocking layer 500 may be attached to the lower protection film 400. The first lower member 600 coated with the light-blocking layer 500 may be attached to the lower protection film 400 by the additional adhesive layer 1050.

The light-blocking layer 500 may be formed by coating the first lower member 600 with a paint containing a light-blocking material. In the step of coating the paint, which contains the light-blocking material, on the first lower member 600, the paint may be coated on the first lower member 600 by a spray coating method. Since the coating of the paint may be performed by the spray coating method, it may be possible to perform a subsequent process, such as an etching process, after the coating step, and the coating process may be performed in a manner suitable for the shape of the openings 611, which may be defined in a folding region of the plate 610.

The light-blocking material of the paint may be black dye, black pigment, or a combination thereof, as described above. The light-blocking material may include carbon black.

The paint may include at least one of a polymer resin, a curing agent, a silane coupling agent, an amorphous silica particle, a cross-linking additive agent, and a solvent. The polymer resin of the paint may be at least one of acrylic, melamine, and epoxy resins. The polymer resin of the paint may be cellulose acetate butyrate. The curing agent of the paint may be block poly isocyanate. The silane coupling agent of the paint may be glycidoxy propyl trimethoxy silane. The cross-linking additive agent of the paint may be a co-cross-linking agent and may be trimethylolpropane trimethacrylate.

Any material, which can dissolve other solutes and allows the paint to be provided as a coating solution, may be used as the solvent of the paint, without any limitation. For example, the solvent may include at least one of formaldehyde, n-butanol, butylacetate, methylisobutyl ketone, isobutyl acetate, 1-methoxy-2-propyl acetate, isobutyl alcohol, ethyleneglycol tert-butyl ether, ethyl benzene, and xylene.

In an embodiment, the paint may include the polymer resin of about 20 wt % to about 30 wt %, the curing agent of about 2 wt % to about 4 wt %, the silane coupling agent of about 1 wt % to about 3 wt %, the amorphous silica particle of about 3 wt % to about 7 wt %, the black pigment of about 1 wt % to about 3 wt %, the cross-linking additive agent of about 5 wt % to about 7 wt %, and the solvent of about 48 wt to about 65 wt %.

In an embodiment, a mean particle size of solid in the paint may range from about 0.1 µm to about 4 82 m. In detail, the mean particle size of solid in the paint may range from about 2 µm to about 3 µm.

The first lower member 600 may be disposed below the light-blocking layer 500. The first lower member 600 may be coated with the light-blocking layer 500 and may be in contact with the light-blocking layer 500. The light-blocking layer 500 may be in contact with a top surface of the plate 610 in the first lower member 600. The first lower member 600 may support other elements disposed thereon. In this sense, the first lower member 600 may be referred to as a supporting member.

The first lower member 600 may include the plate 610, a lower adhesive layer 620, and a cover layer 630. Elements constituting the first lower member 600 are not limited to the afore-described elements. For example, at least one of the afore-described elements may be omitted, and other elements may be further provided as additional elements of the first lower member 600. The plate 610 may include a material whose elastic modulus is greater than about 60 GPa at room temperature. The plate 610 may be formed of or include a metallic material. The plate 610 may include metallic material (e.g., at least one of pure metal and alloys). For example, the plate 610 may be SUS304, but the disclosure is not limited to this example. The plate 610 may support elements disposed thereon. Heat-dissipation characteristics of the electronic device 1000 may be improved by the plate 610.

The opening 611 may be defined in a portion of the plate 610. The opening 611 may be defined in a region of the plate 610 that may overlap the second region 1000A2. When viewed in a plan view (e.g., perpendicular to the third direction DR3), the opening 611 may overlap the second region 1000A2. Due to the presence of the opening 611, a shape of a portion of the plate 610 may be more easily changed.

The cover layer 630 may be attached to the plate 610 by the lower adhesive layer 620. The lower adhesive layer 620 may include a typical adhesive material, a gluing agent, or a combination thereof. In another embodiment unlike that shown in FIG. 2, the lower adhesive layer 620 may not be provided on a region of the plate 610 that may overlap the second region 1000A2. The cover layer 630 may cover the opening 611 of the plate 610. Thus, it may be possible to additionally prevent a contamination material from being supplied into the opening 611.

The cover layer 630 may be formed of or include a material whose elastic modulus is lower than that of the plate 610. The cover layer 630 may be formed of or include at least one of materials having an elastic modulus of about 30 Mpa or lower and an elongation ratio of 100% or less. For example, the cover layer 630 may include at least one of acrylic resins, methacryl resins, polyisoprene resins, vinyl resins, epoxy resins, urethane resins, cellulose resins, siloxane resins, polyimide resins, polyamide resins, and perylene resins. For example, the cover layer 630 may include thermoplastic polyurethane, but the disclosure is not limited to this example. The cover layer 630 may be a thermoplastic polyurethane film, in which a mesh pattern is formed.

The plate 610 may have a thickness ranging from about 120 µm to about 180 µm (for example, of about 150 µm). The lower adhesive layer 620 may have a thickness ranging from about 4 µm to about 15 µm (for example, of about 8 µm). The cover layer 630 may have a thickness ranging from about 4 µm to about 15 µm (for example, of about 8 µm). However, the thicknesses of the plate 610, the lower adhesive layer 620, and the cover layer 630 are not limited to the above values.

The second lower members 700 may be disposed below the first lower member 600. The second lower members 700 may be spaced apart from each other. For example, one of the second lower members 700 may be disposed in the first region 1000A1, and another of the second lower members 700 may be disposed in the third region 1000A3.

Each of the second lower members 700 may be attached to the first lower member 600 by fourth adhesive layers 1040. For example, one of the fourth adhesive layers 1040 may be attached to a bottom surface of the first lower member 600 overlapping the first region 1000A1, and another of the fourth adhesive layers 1040 may be attached to a bottom surface of the first lower member 600 overlapping the third region 1000A3. In other words, the fourth adhesive layers 1040 may not overlap the second region 1000A2. Each of the fourth adhesive layers 1040 may have a thickness ranging from about 8 µm to about 15 µm (e.g., about 8 µm), but the thickness of each of the fourth adhesive layers 1040 is not limited thereto.

Although not shown, a height-difference compensation film may be further provided between each of the second lower members 700 and the first lower member 600. For example, the height-difference compensation film may be provided in a region overlapping the second region 1000A2. The height-difference compensation film may have two opposite surfaces having different adhesion strengths from each other. For example, the height-difference compensation film may have a non-adhesive surface that does not have substantially an adhesive property. The non-adhesive surface may be disposed to face the first lower member 600.

Each of the second lower members 700 may include a lower plate 710, a heat-dissipation sheet 720, and an insulating film 730. Elements constituting the second lower members 700 are not limited to the afore-described elements. For example, at least one of the afore-described elements may be omitted, and other elements may be further provided as additional elements of the second lower members 700.

In an embodiment, the lower plates 710 may be provided in plural. One of the lower plates 710 may overlap the first region 1000A1 and a portion of the second region 1000A2, and another of the lower plates 710 may overlap the third region 1000A3 and another portion of the second region 1000A2.

In the second region 1000A2, the lower plates 710 may be disposed to be spaced apart from each other. Nevertheless, the lower plates 710 may be disposed to have a minimized distance therebetween, thereby supporting a region provided with the opening 611 of the plate 610. For example, the lower plates 710 may prevent the region, on which the opening 611 of the plate 610 may be provided, from being deformed by a downward pressure exerted through upper elements.

Furthermore, the lower plates 710 may be used to prevent the upper elements, which may be disposed on the second lower members 700, from being deformed by lower elements disposed below the second lower members 700.

Each of the lower plates 710 may be formed of or include a metal alloy (e.g., a copper alloy). However, the disclosure is not limited to a specific material of the lower plates 710. Each of the lower plates 710 may have a thickness ranging from about 60 μm to about 100 μm (for example, about 80 μm), but the thickness of the lower plates 710 is not limited thereto.

The heat-dissipation sheet 720 may be attached to a bottom surface of the lower plate 710. The heat-dissipation sheet 720 may be a thermally conductive sheet with high thermal conductivity. For example, the heat-dissipation sheet 720 may include a heat-dissipation layer 721, a first heat-dissipation adhesive layer 722, a second heat-dissipation adhesive layer 723, and a gap tape 724.

The gap tape 724 may be attached to the first and second heat-dissipation adhesive layers 722 and 723, which may be spaced apart from each other with the heat-dissipation layer 721 interposed therebetween. The gap tape 724 may include layers. For example, the gap tape 724 may include a substrate layer, an upper adhesive layer disposed on a top surface of the substrate layer, and a lower adhesive layer disposed on a bottom surface of the substrate layer.

The heat-dissipation layer 721 may be attached to the lower plate 710 by the first heat-dissipation adhesive layer 722. The heat-dissipation layer 721 may be hermetically sealed by the first heat-dissipation adhesive layer 722, the second heat-dissipation adhesive layer 723, and the gap tape 724. The heat-dissipation layer 721 may be a graphitized polymer film. The polymer film may be, for example, a polyimide film. Each of the first and second heat-dissipation adhesive layers 722 and 723 may have a thickness ranging from about 3 μm to about 8 μm (for example, about 5 μm). Each of the heat-dissipation layer 721 and the gap tape 724 may have a thickness ranging from about 10 μm to about 25 μm (for example, about 17 μm). However, the thickness of each of the first heat-dissipation adhesive layer 722, the second heat-dissipation adhesive layer 723, the heat-dissipation layer 721, and the gap tape 724 is not limited to the above value or range.

The insulating film 730 may be attached to a bottom surface of the heat-dissipation sheet 720. For example, the insulating film 730 may be attached to the second heat-dissipation adhesive layer 723. Due to the insulating film 730, it may be possible to prevent a rattle issue from occurring in the electronic device 1000. The insulating film 730 may have a thickness of about 15 μm, but the disclosure is not limited to this example.

The height-difference compensation member 800 may be attached to a bottom surface of the plate 610. For example, the lower adhesive layer 620 may be attached to a portion of the bottom surface of the plate 610, and the height-difference compensation member 800 may be attached to another portion of the bottom surface of the plate 610.

The height-difference compensation member 800 may include a first compensation adhesive layer 810, a height-difference compensation film 820, and a second compensation adhesive layer 830. The first compensation adhesive layer 810 may be attached to the bottom surface of the plate 610. The height-difference compensation film 820 may be a synthetic resin film. The second compensation adhesive layer 830 may be attached to a bottom surface of the height-difference compensation film 820 and a set (not shown).

Although not shown, a cushion film including a cushion layer may be further disposed below the second lower member 700 or below the height-difference compensation member 800.

According to an embodiment of the disclosure, an electronic device may include a first lower member, which may be disposed below a window and a display panel to support the window and the display panel, and a light-blocking layer, which may be disposed on the first lower member and include a black material. The light-blocking layer may be coated on a top surface of a metal plate in the first lower member. Accordingly, the electronic device may be provided to have an improved impact resistant property against an external impact and to effectively suppress reflection of an external light.

In more detail, if an elastic cushion layer (e.g., a sponge) is provided between a protection film and the first lower member, the window and the display panel on the first lower member may be also compressed when the cushion layer is compressed by an external impact, and a failure, such as crack or warpage, may occur. However, in the electronic device according to an embodiment of the disclosure, the cushion layer may be omitted from a region between the protection film and the first lower member or may be moved to another region (e.g., below a second lower member), and the first lower member coated with the light-blocking layer may be directly attached to the lower protection film, which may be disposed below the display panel, by an adhesive layer. Accordingly, it may be possible to improve an impact resistant property of the electronic device against the external impact, compared with the case of the elastic cushion layer provided between the first lower member and the display panel. The light-blocking layer may include a black light-blocking material, and it may be possible to prevent an external light from being reflected by the metal plate and thereby to improve visibility of the electronic device.

Figure 4:
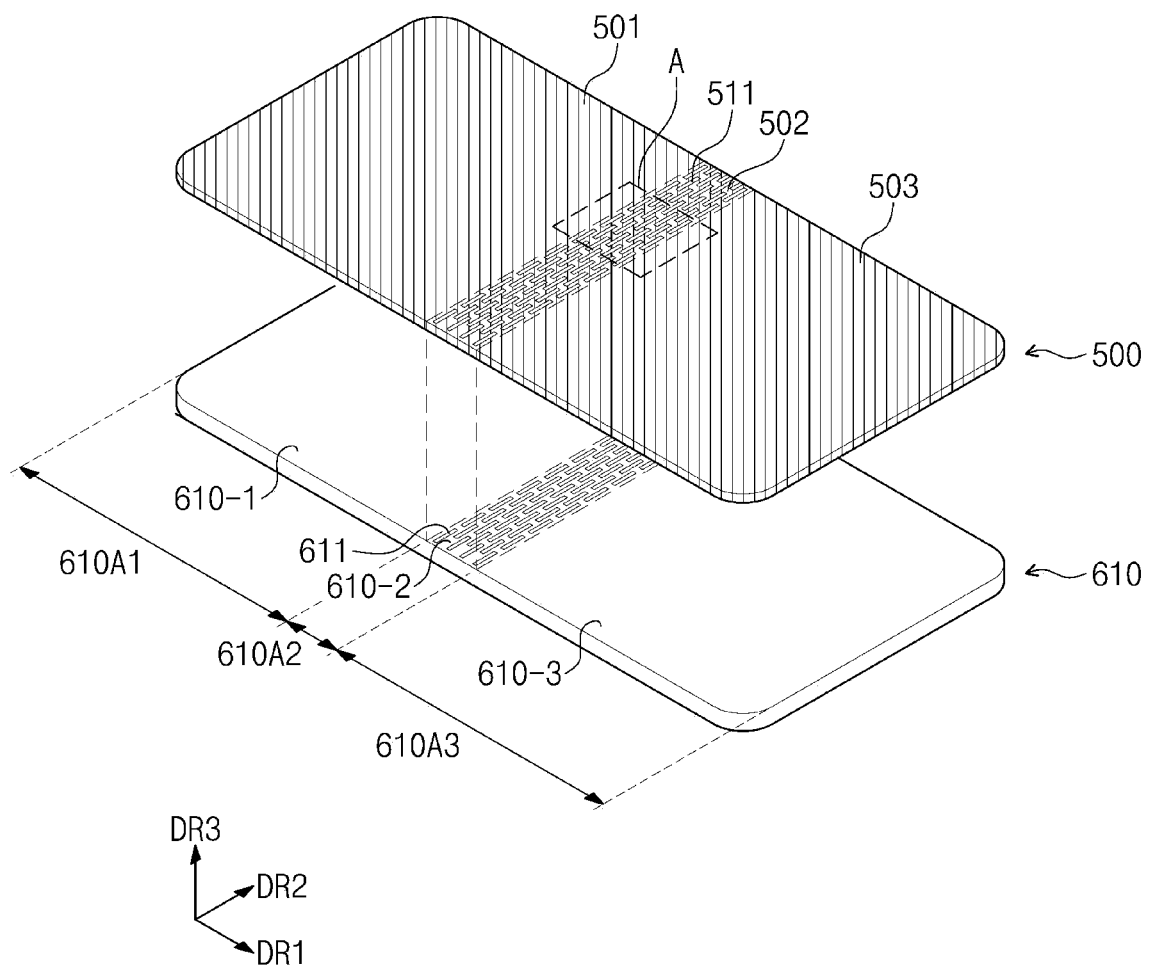
FIG. 4 is a schematic perspective view illustrating select elements of an electronic device according to an embodiment of the disclosure.
Figure 5A:
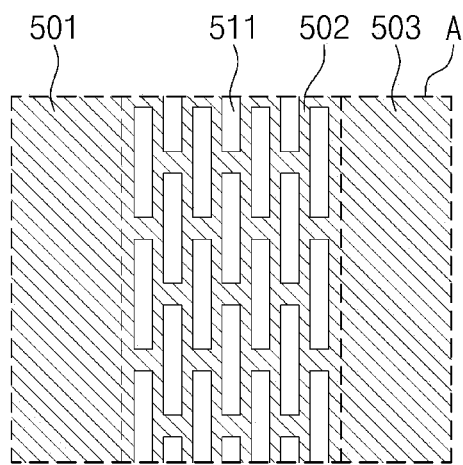
FIGS. 5A and 5B are schematic plan views, each of which illustrates a region of an electronic device according to an embodiment of the disclosure.
Figure 5B:
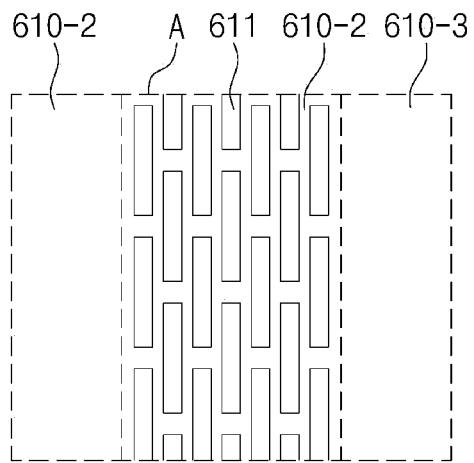

FIG. 4 is a schematic perspective view illustrating select elements of an electronic device according to an embodiment of the disclosure. For example, FIG. 4 is an exploded perspective view illustrating select elements of the electronic device (e.g., the plate 610 in the first lower member and the light-blocking layer 500 on the plate 610). FIG. 5A is a schematic plan view illustrating a portion of an electronic device, which may overlap region A of FIG. 4, according to an embodiment of the disclosure. FIG. 5B is a schematic plan view illustrating a portion of an electronic device, which may overlap region A of FIG. 4, according to an embodiment of the disclosure. For example, FIG. 5A illustrates a portion of the light-blocking layer 500 overlapping region A of FIG. 4, and FIG. 5B illustrates a portion of the plate 610 overlapping region A of FIG. 4.

Referring to FIGS. 2, 4, 5A, and 5B, the plate 610 of the electronic device may include a first non-folding region 610A1, a folding region 610A2, and a second non-folding region 610A3, which may be arranged in the first direction DR1. The folding region 610A2 of the plate 610 may overlap the second region 1000A2 of the active region 1000A of the electronic device 1000. The first and second non-folding regions 610A1 and 610A3 of the plate 610 may be adjacent to the folding region 610A2, at least a portion of the first non-folding region 610A1 may overlap the first region 1000A1 of the active region 1000A of the electronic device 1000, and at least a portion of the second non-folding region 610A3 may overlap the third region 1000A3 of the active region 1000A of the electronic device 1000. At least a portion of the first and second non-folding regions 610A1 and 610A3 may overlap the peripheral region 1000NA of the electronic device 1000. The plate 610 may include a first portion 610-1 overlapping the first non-folding region 610A1, a second portion 610-2 overlapping the folding region 610A2, and a third portion 610-3 overlapping the second non-folding region 610A3.

The plate 610 may include openings 611 that may overlap the folding region 610A2. For example, the openings 611 overlapping the folding region 610A2 may be defined in the plate 610. The openings 611 may overlap the second region 1000A2 of the active region 1000A of the electronic device 1000. The openings 611 may be provided to form rows. In an embodiment, the opening 611 may be arranged to form rows which may be shifted from each other in an alternate manner.

The light-blocking layer 500 may include a first light-blocking portion 501 overlapping the first non-folding region 610A1 of the plate 610, a second light-blocking portion 502 overlapping the folding region 610A2, and a third light-blocking portion 503 overlapping the second non-folding region 610A3. The first light-blocking portion 501 may overlap the first portion 610-1 of the plate 610, the second light-blocking portion 502 may overlap the second portion 610-2 of the plate 610, and the third light-blocking portion 503 may overlap the third portion 610-3 of the plate 610.

The light-blocking layer 500 may include light-blocking openings 511 in the second light-blocking portion 502. For example, light-blocking openings 511 may be defined in the second light-blocking portion 502 of the light-blocking layer 500. When viewed in a plan view, the light-blocking openings 511 may respectively overlap the openings 611 defined in the folding region 610A2 of the plate 610. In detail, the light-blocking openings 511 may be defined to have the same shape and arrangement of the openings 611. For example, the light-blocking openings 511 may be arranged to form rows which may be shifted from each other in an alternate manner. In the process of coating the top surface of the plate 610 with the light-blocking layer 500, the paint containing the light-blocking material may be coated on the remaining region of the plate 610, other than the opening 611, to form the light-blocking layer 500. Accordingly, the light-blocking opening 511 and the opening 611 may fully overlap each other.

Since the light-blocking openings 511 defined in the light-blocking layer 500 may fully overlap the openings 611 defined in the plate 610, the openings 611 defined in the plate 610 may not be covered with the light-blocking layer 500 and may remain open, when viewed in a plan view. Accordingly, a folding property of the folding region 610A2 of the plate 610 may not be deteriorated, and the shape of the folding region 610A2 may be more easily changed by the folding operation.

Figure 6:
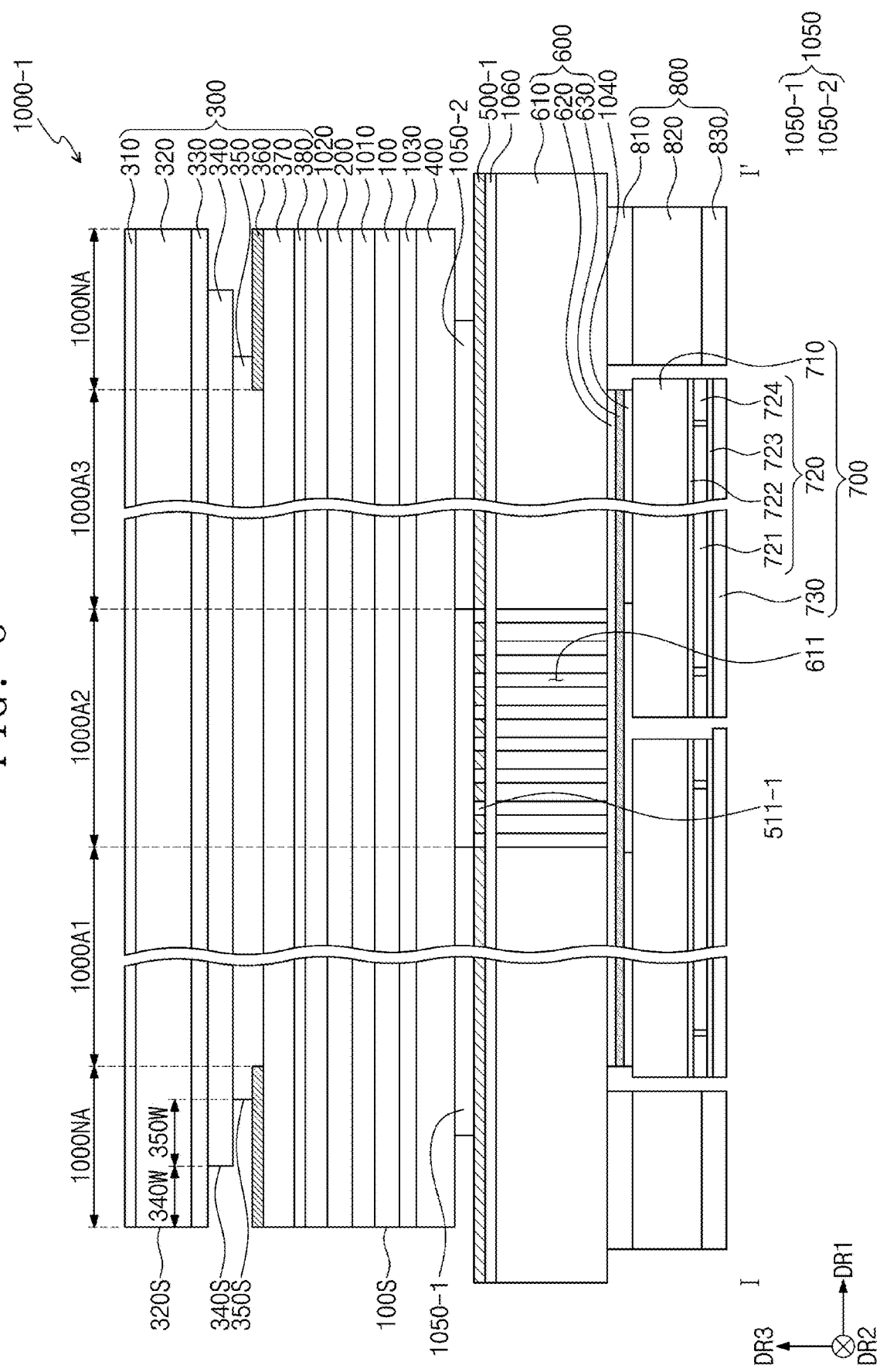
FIG. 6 is a schematic sectional view illustrating an electronic device according to an embodiment of the disclosure.

FIG. 6 is a schematic sectional view illustrating an electronic device according to an embodiment of the disclosure. For example, FIG. 6 is a sectional view taken along the line I-I' of FIG. 1A. In the following description of an electronic device 1000-1 of FIG. 6, an element previously described with reference to FIGS. 2, 3, 4, 5A, and 5B may be identified by the same reference number without repeating a redundant description thereof In the electronic device 1000-1 of FIG. 6, a light-blocking layer 500-1 may be attached to the first lower member 600 through an additional light-blocking adhesive layer 1060, unlike the electronic device 1000 of FIG. 2. The light-blocking layer 500-1 may be provided in the form of a light-blocking sheet and may be attached to the first lower member 600 through the light-blocking adhesive layer 1060. The light-blocking layer 500-1 may be directly attached to the first lower member 600 through the light-blocking adhesive layer 1060. For example, the light-blocking layer 500-1 may be in contact with a top surface of the light-blocking adhesive layer 1060, and the first lower member 600 may be in contact with a bottom surface of the light-blocking adhesive layer 1060.

The light-blocking layer 500-1 may be attached to the first lower member 600 through the light-blocking adhesive layer 1060. For example, the light-blocking layer 500-1 may be attached to the top surface of the plate 610 through the light-blocking adhesive layer 1060. The light-blocking adhesive layer 1060 may include a typical adhesive material, a gluing agent, or a combination thereof. In another embodiment unlike that shown in FIG. 6, the light-blocking adhesive layer 1060 may not be disposed on a region of the plate 610 overlapping the second region 1000A2.

Light-blocking openings 511-1 may be defined in the light-blocking layer 500-1. The light-blocking openings 511-1 may respectively overlap the openings 611 of the plate 610, when viewed in a plan view. The light-blocking openings 511-1, which may be defined in the light-blocking layer 500, may fully overlap the openings 611, which may be defined in the plate 610.

Figure 7:
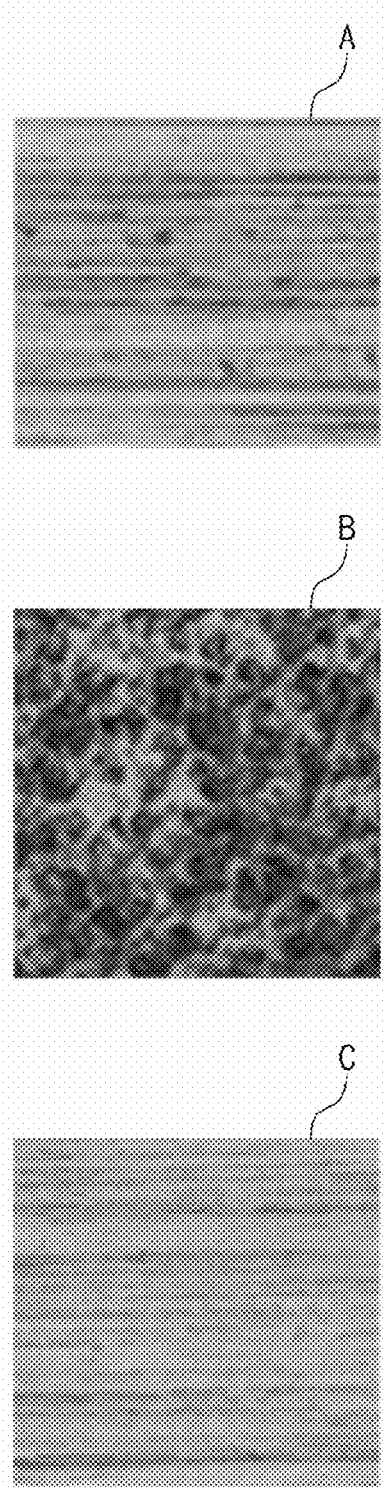
FIG. 7 is a schematic diagram including images, which were taken to show surface roughness characteristics of plates according to an example embodiment and a comparative embodiment.

FIG. 7 is a schematic diagram including images, which were taken to show surface roughness characteristics of plates according to an example embodiment and a comparative embodiment.

In FIG. 7, the image A shows a surface of a plate, on which a light-blocking coating layer was not formed, and the images B and C show surfaces of plates, on which light-blocking coating layers were coated. The light-blocking coating layer in the image B was formed using a paint containing solid having a mean particle size of about 5 μm, and the light-blocking coating layer in the image C was formed using a paint containing solid having a mean particle size of about 2 μm.

In FIG. 7, the measured values of surface roughness were about 0.1 μm, about 0.26 μm, and about 0.05 μm, respectively, for the plates shown in the images A, B, and C.

These measurement results of surface roughness show that, if a light-blocking layer is formed on a top surface of a plate by coating a paint, which includes solid particles whose mean particle size is less than about 0.4 μm, it may be possible to allow a lower member to have a low surface roughness and thereby to prevent deterioration in display quality of an electronic device.

FIG. 8 is a schematic diagram including images, which were taken to show surface adhesion strength characteristics of plates according to an example embodiment and a comparative embodiment.

In FIG. 8, each of the images A and B shows a top surface of a coating layer, which was prepared by forming an adhesive layer attached with a release film on a coating layer and removing the release film, and the image B shows a top surface of a coating layer, which was prepared by forming an adhesive layer attached with a release film on a coating layer and removing the release film. Surface adhesion strengths of the coating layers had about 476 gf and about 990 gf, respectively, for the images A and B.

FIG. 8 shows that if the surface adhesion strength of the light-blocking coating layer is less than about 800 gf (e.g., about 476 gf), it may be less than an adhesion strength between the release film and the adhesive layer, and thus, the adhesive layer may be removed, along with the release film, or may be partially detached to form a stain, when the release film is removed. However, in the case of the light-blocking coating layer according to an embodiment of the disclosure, the surface adhesion strength between the light-blocking coating layer and the adhesive layer may be greater than about 800 gf, and thus, it may be greater than that between the release film and the adhesive layer. Thus, the adhesive layer may not be detached, when the release film is removed, and thus, an electronic device with improved reliability may be provided.

Figure 9A:
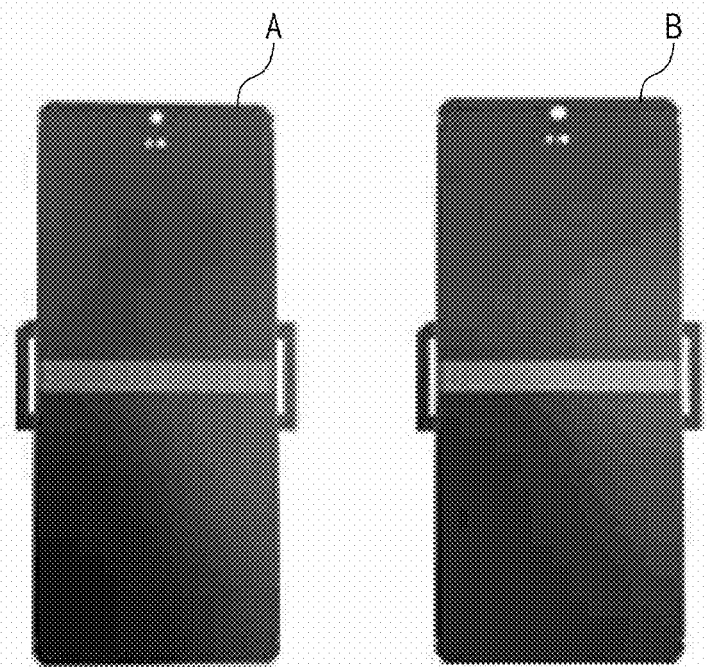
Figure 9B:
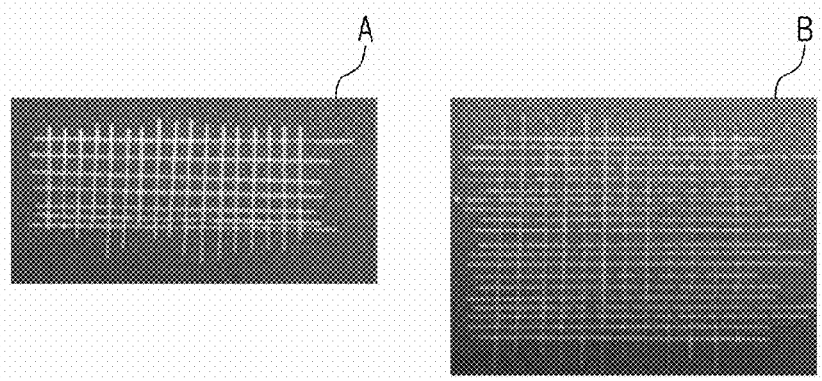

FIGS. 9A to 9C are schematic diagrams including images, which were taken to evaluate characteristics of an electronic device according to an embodiment of the disclosure. A plate coated with a light-blocking coating layer according to an embodiment of the disclosure was used as a sample in each of the experiments of FIGS. 9A to 9C.

In the experiment of FIG. 9A, the sample was maintained, for about 24 hours, under the condition of high temperature (e.g., about 70° C.) and high humidity (e.g., about 90%). Two images were taken from the sample so as to examine whether a detachment or discoloring issue occurred under the high-temperature and high-humidity condition. In FIG. 9A, the images A and B show surface images of the sample that were respectively taken before and after the test under the high-temperature and high-humidity condition. FIG. 9A shows that, when the light-blocking coating layer according to an embodiment of the disclosure was used, the detachment or discoloring issue did not occur at an edge, even under the high-temperature and high-humidity condition.

In the experiment of FIG. 9B, scratches were formed on the sample, and the sample was tested under a heated bath condition of about 80° C. to know whether an exfoliation phenomenon occurred near the scratch under such a condition. In FIG. 9B, the images A and B show surface images of the sample that were respectively taken before and after the heated bath condition. FIG. 9B shows that, when the light-blocking coating layer according to an embodiment of the disclosure was used, the exfoliation phenomenon did not occur near the scratch, even under the heated bath condition.

In the experiment of FIG. 9C, a folding operation was repeatedly performed on the sample, and the sample was examined to know whether an exfoliation or crack occurred on the coating layer near a folding portion. The image of FIG. 9C shows the sample, after performing the folding operation about 150,000 times. FIG. 9C shows that, when the light-blocking coating layer according to an embodiment of the disclosure was used and the folding operation was repeated within a reasonable extent, the crack or coating exfoliation did not occur near the folding portion.

Referring to the results in FIGS. 9A to 9C, in the case where the light-blocking coating layer according to an embodiment of the disclosure was used, a failure, such as the crack or coating exfoliation, of a coating layer did not occur under various reliability evaluation conditions (e.g., the high-temperature and high-humidity condition, the heated bath condition, and the repetitive-folding condition). This shows that it may be possible to improve the reliability and durability of the electronic device including the light-blocking coating layer according to an embodiment of the disclosure.

The following table 1 summarizes impact-resistant and repelling properties in electronic devices according to two different embodiments. Data in the row of "Example Embodiment" represent an electronic device including a plate, which was coated with a light-blocking coating layer according to an embodiment of the disclosure, or have the stacking structure of FIG. 2. Data in the row of "Comparative Embodiment" represent an electronic device including an elastic cushion layer provided between a plate and a lower protection member. In Table 1, the item of "impact resistance" was obtained by measuring the minimum height of a bright spot that occurred through a pen drop test, and the item of "repelling property" was obtained by multiplying a repellant force, which exerted against an object falling from a specific height, by the height.

TABLE 1

| Embodiments | Impact resistance (cm) | Repelling property (N*cm) | |
| --- | --- | --- | --- |
| | | Room temperature (about 20° C.) | Low temperature (about −20° C.) |
| Example Embodiment | about 10.7 | about 7.17 | about 12.8 |
| Comparative embodiment | about 4 | about 10.3 | about 25.0 |

Referring to the result of Table 1, when compared with the comparative embodiment, in the case of the electronic device including the plate coated with the light-blocking coating layer according to an embodiment of the disclosure, a height, at which a bright spot occurred, was increased by about 2.5 times, and the repelling property was reduced by about 30% at room temperature and by about 45% at the low temperature. These results show that the electronic device including the plate coated with the light-blocking coating layer according to an embodiment of the disclosure can have a robust impact resistance property against an external impact, compared with the electronic device including the discussed elastic cushion layer, and thus the durability and reliability of the electronic device can be improved.

In a display panel according to an embodiment of the disclosure, a cushion layer may be omitted from a space between a lower protection film and a metal supporting member, and a light-blocking layer may be coated on the metal supporting member or may be attached to the metal supporting member in the form of a sheet. The electronic device has an improved impact resistance property and prevents reflection of an external light, which may be caused by the metal supporting member.

While example embodiments of the disclosure have been particularly shown and described, it will be understood by one of ordinary skill in the art that variations in form and detail may be made therein without departing from the spirit and scope of the attached claims including equivalents thereof.

What is claimed is:

1. An electronic device, comprising:
a window;
a display panel disposed below the window;
a supporting member disposed below the display panel; and
a light-blocking layer disposed on the supporting member, wherein the light-blocking layer comprises a light-blocking material,
the light-blocking layer is directly disposed on the supporting member or is directly attached to the supporting member by an adhesive layer,
the supporting member comprises a plate comprising a folding region,
the pate includes a plurality of openings that overlap the folding region, and
the light-blocking layer includes a plurality of openings that overlap the plurality of openings of the plate.

2. The electronic device of claim 1, wherein
the plate includes a metallic material, and
the light-blocking layer is directly disposed on the plate or is directly attached to the plate by the adhesive layer.

3. The electronic device of claim 2, wherein
the plate further comprises a first non-folding region and a second non-folding region with the folding region disposed therebetween.

4. The electronic device of claim 1, wherein the light-blocking layer comprises at least one of a black dye and a black pigment.

5. The electronic device of claim 4, wherein the light-blocking layer comprises at least one of a polymer resin, a curing agent, a silane coupling agent, and an amorphous silica particle.

6. The electronic device of claim 4, wherein a mean particle size of a solid in the light-blocking layer ranges from about 0.1 μm to about 4 μm.

7. The electronic device of claim 4, wherein the light-blocking layer comprises a cross-linking additive agent.

8. The electronic device of claim 1, wherein the light-blocking layer is a light-blocking coating layer directly coated on the supporting member.

9. The electronic device of claim 1, wherein the light-blocking layer is a light-blocking sheet attached to the supporting member by the adhesive layer.

10. The electronic device of claim 1, further comprising a lower protection film disposed below the display panel,
wherein the light-blocking layer is directly attached to the lower protection film by an additional adhesive layer.

11. The electronic device of claim 1, wherein a thickness of the light-blocking layer ranges from about 7 μm to about 13 μm.

12. The electronic device of claim 1, wherein a surface roughness of the light-blocking layer is less than or equal to about 0.10 μm.

13. The electronic device of claim 1, wherein a surface adhesion strength of the light-blocking layer is greater than or equal to about 800 gf.

14. An electronic device, comprising:
a window;
a display panel disposed below the window;
a supporting member disposed below the display panel; and
a light-blocking layer disposed on the supporting member, wherein
the light-blocking layer comprises a light-blocking material and is directly coated on the supporting member,
the supporting member includes a first non-folding region, a second non-folding region, and a folding region disposed therebetween, the folding region including a plurality of openings, and
the light-blocking layer includes a plurality of openings that overlap the plurality of openings of the supporting member.

* * * * *